(12) United States Patent
Roberts et al.

(10) Patent No.: US 6,461,914 B1
(45) Date of Patent: Oct. 8, 2002

(54) PROCESS FOR MAKING A MIM CAPACITOR

(75) Inventors: Douglas R. Roberts, Austin, TX (US); Eric Luckowski, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/942,208

(22) Filed: Aug. 29, 2001

(51) Int. Cl.[7] ...................... H01L 21/8242; H01L 21/20
(52) U.S. Cl. ........................ 438/253; 438/240; 438/241; 438/396
(58) Field of Search .................. 438/253, 396, 438/250, 239, 240, 241, 256, 259; 257/306, 301

(56) References Cited

U.S. PATENT DOCUMENTS

| | | | |
|---|---|---|---|
| 5,731,634 A | * 3/1998 | Matsuo et al. | 257/751 |
| 6,090,661 A | * 7/2000 | Perng et al. | 257/301 |
| 6,107,136 A | * 8/2000 | Melnick et al. | 257/306 |
| 6,130,102 A | 10/2000 | White, Jr. et al. | 438/3 |
| 6,166,423 A | * 12/2000 | Gambino et al. | 257/532 |
| 6,235,579 B1 | 5/2001 | Lou | 438/253 |
| 6,255,217 B1 | * 7/2001 | Agnello et al. | 438/618 |
| 6,274,424 B1 | * 8/2001 | White et al. | 438/239 |
| 6,313,003 B1 | * 11/2001 | Chen | 438/148 |
| 6,329,234 B1 | * 12/2001 | Ma et al. | 257/301 |
| 2001/0053591 A1 | * 12/2001 | Buchwalter et al. | 438/584 |

FOREIGN PATENT DOCUMENTS

EP  0 862 203 A1  9/1998 ....... H01L/21/3205

OTHER PUBLICATIONS

Peter Zurcher et al., "Integration of Thin Film MIM Capacitors and Resistors into Copper Metallization based RF–CMOS and Bi–CMOS Technologies", 2000 IEDM, 4 pgs. No month.

M. Armacost et al., "A High Reliability Metal Insulator Metal Capacitor for 0.18 μm Copper Technology", 2000 IEEE, 4 pgs. No month.

* cited by examiner

*Primary Examiner*—Michael S. Lebentritt
(74) *Attorney, Agent, or Firm*—Kim-Marie Vo; Daniel D. Hill

(57) ABSTRACT

A process for forming a metal-insulator-metal (MIM) capacitor structure includes forming a recess in the dielectric layer (20) of a semiconductor substrate (10). A first capacitor electrode (30, 40) is formed in the recess having a copper first metal layer (30) with a conductive oxidation barrier (40) formed over the first metal layer (30). The first capacitor electrode (30, 40) is planarized relative to the dielectric layer (20). An insulator (50) is formed over the first capacitor electrode (30, 40) and a second capacitor electrode (65) is formed over the insulator (50). Forming the first capacitor electrode (30, 40) in the recess maintains the alignment of a periphery of the copper first metal layer (30) with the conductive oxidation barrier (40).

10 Claims, 5 Drawing Sheets

PROCESS FOR MAKING A MIM CAPACITOR

RELATED APPLICATION

The present invention relates to a co-pending application entitled "MIM Capacitor Structure and Process for Making the Same" which was filed on Jul. 14, 2001 and is assigned to the same assignee as the present application. The present invention relates to another co-pending application entitled "Self-Aligned Magnetic Clad Write Line and Its Method of Formation" which was filed on Nov. 15, 2000 and has a Ser. No. 09/713,734 and is assigned to the same assignee as the present application.

FIELD OF THE INVENTION

This invention relates, generally, to the field of semiconductor devices and more particularly to metal-insulator-metal (MIM) capacitors as used in semiconduct or devices.

BACKGROUND OF THE INVENTION

As semiconductor devices shrink, there is a desire to decrease the area occupied by features, such as capacitors. To accommodate, capacitors are being formed over transistors (e.g. at the metal level) as opposed to being formed at the transistor level nearer the bulk semiconductor substrate. One example of such a capacitor is a metal-insulator-metal (MIM) capacitor. At the metal level, polysilicon cannot be used as an electrode material because deposition of polysilicon is a high temperature process that is not compatible with back-end (post-metal) processing. Copper is replacing aluminum and aluminum alloys as the predominant material for metal interconnects in semiconductor manufacturing. Therefore, it would be advantageous to use copper as the metal of a MIM capacitor electrode to avoid having to add further materials and processing steps. However, there are problems associated with using copper in conjunction with many of the high dielectric constant materials which are desirable for use in a MIM capacitor, particularly capacitors used in RF applications that require high capacitance linearity. A highly linear capacitance is one that is constant as a function of applied voltage and frequency. Known problems with using copper as an electrode material include adverse affects caused by poor mechanical and chemical stability of the copper surface, and other interactions of the copper with the capacitor dielectric materials (e.g. copper diffusion).

Therefore, a need exists for a MIM capacitor structure which includes use of copper as a capacitor electrode in which the fabrication can be easily integrated with the rest of the semiconductor manufacturing sequence, which results in a capacitor with high linearity and high capacitance, and which alleviates many of the problems associated with having copper as one of the capacitor electrodes.

BRIEF DESCRIPTION OF THE DRAWINGS

The present invention is illustrated by way of example and not by limitation in which like references indicate similar elements, and in which.

Figure 1:
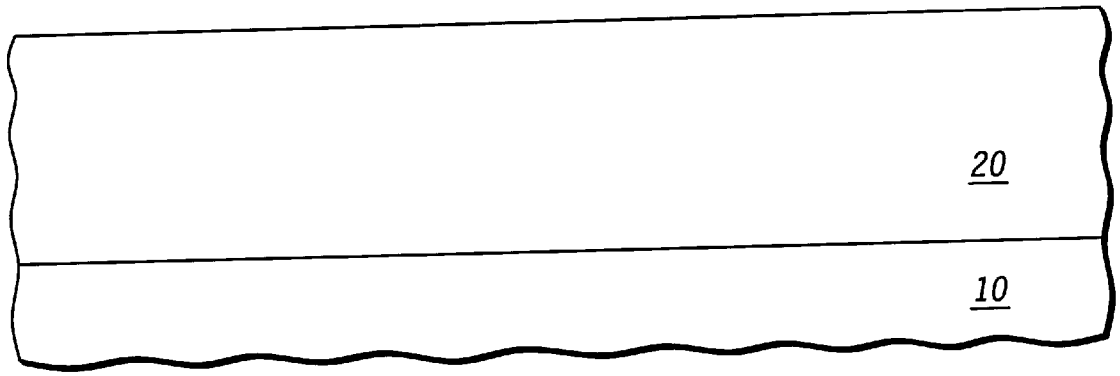
FIG. 1 illustrates, in cross-section, a portion of semiconductor device with a semiconductor device and a dielectric layer as can be used to form a MIM capacitor in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

To increase the capacitance of MIM capacitor structures, the use of metal oxide materials as the capacitor dielectric is desirable due to their high dielectric constants. Generally, such metal oxides have dielectric constants greater than approximately 20. However, when forming metal oxides over a copper electrode, the copper undesirably oxidizes creating an incompatible interface between the electrode and subsequently deposited materials. More specifically, the adhesion properties between the capacitor dielectric and the electrode are poor and the presence of the copper oxide film can undesirably increase capacitor leakage.

By forming a conductive oxidation barrier layer 40 between the copper electrode 30 and the metal oxide 50 in accordance with the present invention, a MIM capacitor with a high capacitance density and good adhesion between a metal oxide dielectric 50 and a copper electrode 30 is formed. To decrease processing complexity the conductive oxidation barrier layer 40 is formed within a recess 205 over the copper opening 200. The bottom electrode of the MIM capacitor includes the conductive oxidation barrier layer 40 and the copper electrode 30. In a preferred embodiment, the conductive oxidation barrier layer 40 is tantalum nitride. A tantalum oxide or hafnium oxide capacitor dielectric can then be deposited without the formation of a copper oxide layer. Consequently, the final capacitor structure can have high capacitance, low leakage, and stable interfaces and be easily formed. One embodiment of the invention using a conductive oxidation barrier layer will be described in regards to the figures.

FIGS. 1–11 illustrate a portion of a semiconductor device as it undergoes a series of processing steps to form a MIM capacitor in accordance with the present invention. More specifically, FIG. 1 illustrates a dielectric layer 20 formed overlying a semiconductor substrate 10. In a preferred embodiment, semiconductor substrate 10 is silicon. However, other semiconductor materials can be used such as gallium arsenide and silicon-on-insulator (SOI). Typically, substrate 10 will include a number and variety of active semiconductor devices (such as metal-oxide-semiconductor (MOS) and/or bipolar transistors). However, for purposes of understanding the present invention, an understanding of these devices is not necessary and thus these devices are not illustrated.

The dielectric layer 20 is deposited by chemical vapor deposition (CVD), physical vapor deposition (PVD), the like, or combinations of the above and can be any dielectric material, such as silicon oxide.

Figure 2:
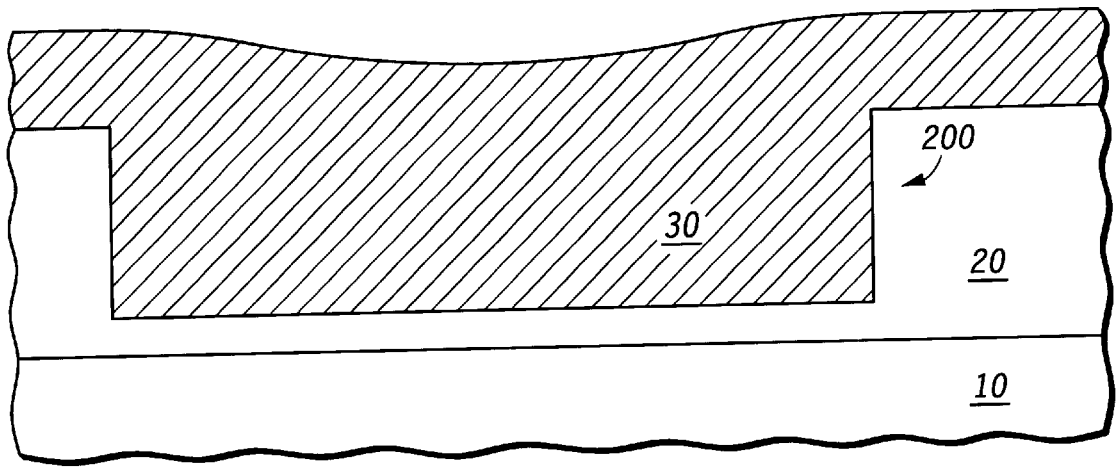
FIG. 2 illustrates the device of FIG. 1 after forming an opening and depositing a first metal layer in accordance with one embodiment of the present invention.

To form the structure of FIG. 2, the dielectric layer 20 is patterned and etched to form an opening 200, sometimes referred to as a trench or recess. A first metal layer 30 is formed over the dielectric layer 20 and within the opening, preferably by depositing the electrode material using PVD, CVD, electroplating combinations of these, or the like. In a preferred embodiment the first metal layer 30 comprises copper. For example, the first metal layer 30 can be copper or an aluminum copper alloy. In one embodiment, the first metal layer 30 is predominately copper. The metal layer material can be deposited using PVD, CVD, atomic layer deposition (ALD), electroplating, combinations of the above or the like. Furthermore, the first metal layer 30 may actually be formed of multiple materials. For instance in copper inlaid metallization schemes, the trench is often lined with a diffusion barrier comprising tantalum or tantalum nitride.

Figure 3:
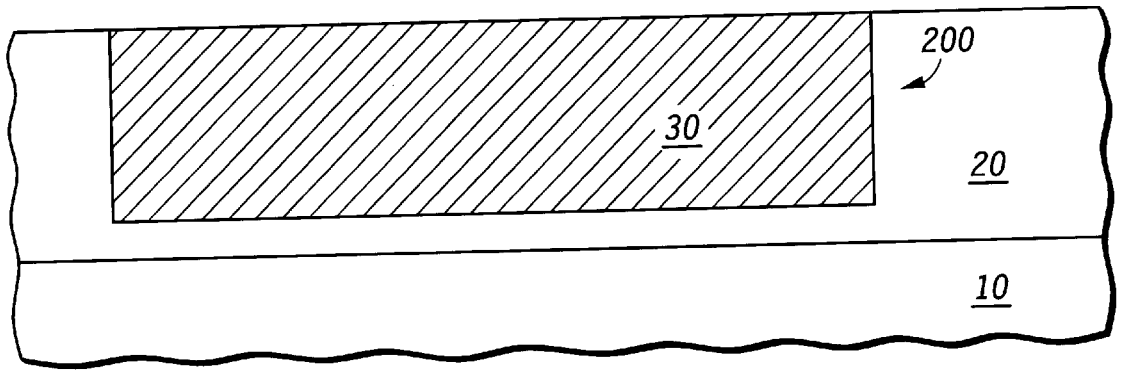
FIG. 3 illustrates the device of FIG. 2 after planarizing the first metal layer in accordance with one embodiment of the present invention.

Shown in FIG. 3 is the semiconductor device after planarizing the first metal layer 30 to form the first metal layer 30, which is a damascene structure. The first metal layer 30 can be planarized by chemical mechanical polishing (CMP), etch-back, such as a wet or dry etch process, or the like. If the first metal layer 30 is polished, it may be slotted to help control dishing of the copper during polishing. Capacitor area is generally larger than the adjacent integrated circuit interconnect circuitry, and large areas of copper are susceptible to dishing during polishing. Slotting the material in this case is known to alleviate the problem.

Figure 4:
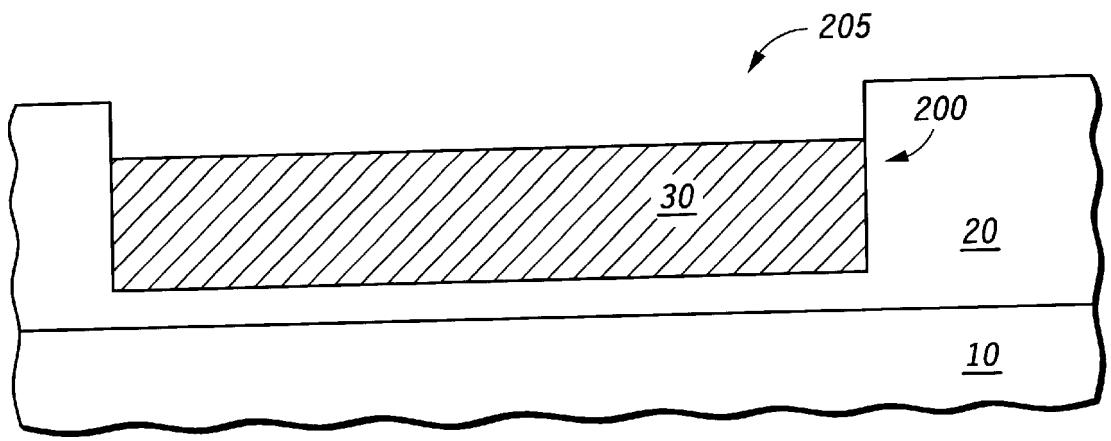
FIG. 4 illustrates the device of FIG. 3 after etching the first metal layer to form a recess in accordance with one embodiment of the present invention.

Shown in FIG. 4 portions of the first metal layer 30 are removed to form a recess 205 within the opening 200 to form the first metal layer 30. In other words, the first metal layer 30 is recessed. The recess 205 extends below the uppermost portions of the trench 200. In accordance with one specific embodiment, the recess 205 is formed using a reactive ion etch (RIE) process or a wet etch process which removes portions of the first metal layer 30 at a rate of approximately 3–5 times greater than it removes portions of the dielectric layer 20. Typically, the recess 205 is between approximately 50 to 2000 Angstroms in depth and is approximately ¼ to ⅓ the depth of the opening 200. The amount of recess 205 is determined by the thickness requirements of a subsequently formed bottom electrode as will be explained later. In one embodiment, the recess 205 is formed using a wet etchant in a spin-etch process. In such a spin-etch process, the semiconductor device is placed on a chuck, rotated at a speed of 1000–1200 rpm, and the etchant dispensed onto the semiconductor device. The etch process is typically 10–60 seconds in duration. The actual etch step is typically followed by a 10–30 second spin-rinse step using deionized water in the same process tool as the spin-etch. The etchant chemistry employed depends on the composition of the first metal layer 30. For example, if the first metal layer 30 is copper the etchant may contain acids such as $HNO_3$, $HCl$ $H_2SO_4$, or combinations thereof.

Alternatively, the recess 205 can be formed using a single spin-etch process after forming the first metal layer 30 as opposed to first planarizing the first metal layer 30 and then etching it. In this embodiment, the wafer rotation speed, etchant chemistry, and etchant dispensation distribution are additionally optimized to control the uniformity and planarization properties of the etching process.

Figure 5:
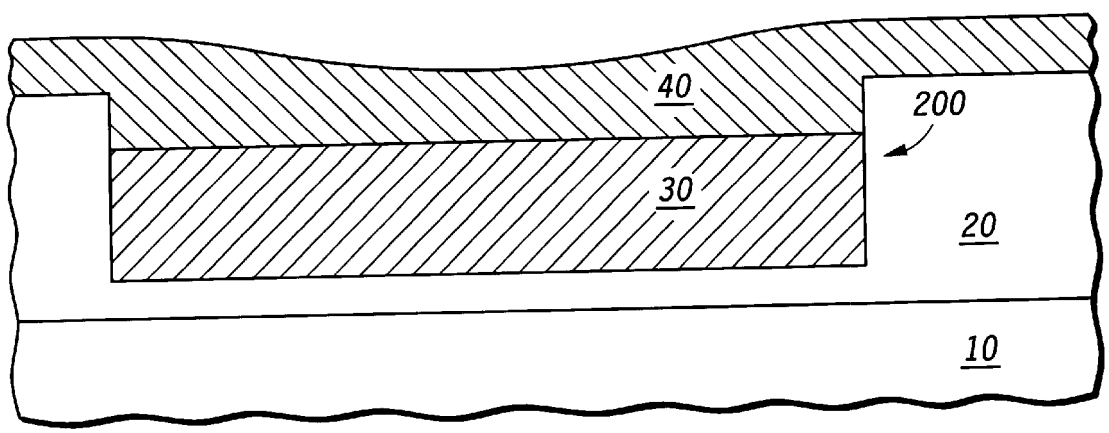
FIG. 5 illustrates the device of FIG. 4 after depositing a second metal layer within the recess in accordance with one embodiment of the present invention.

After forming the recess 205, a conductive oxidation barrier layer 40 is formed by PVD, CVD, ALD, electroplating, electroless plating, combinations of the above or the like, as shown in FIG. 5. The conductive oxidation barrier layer 40 is deposited over the surface of the dielectric layer 20 and the recessed first metal layer 30. The conductive oxidation barrier layer 40 can be any material that can serve as both an oxidation and barrier layer to the underlying first metal layer 30. Materials that are both good oxidation and barrier layers to materials including copper are tantalum, titanium, platinum, iridium, aluminum, ruthenium, tungsten, tantalum nitride, titanium nitride, and the like. Generally, the conductive oxidation barrier layer 40 is a metal or metal alloy and can be referred to as the second metal layer 40. In a preferred embodiment, the conductive oxidation barrier layer 40 fills the recess 205 in order to form a substantially planar surface for subsequent formation of overlying films. Hence, the conductive oxidation barrier layer is 50 to 2000 Angstroms in thickness. However, it is not necessary for the first metal layer 30 and the conductive oxidation barrier layer 40 to completely fill the opening 200. The conductive oxidation barrier layer 40 should be thick enough to serve as both an oxidation and metal diffusion barrier layer to the first metal layer 30. In addition, the conductive oxidation barrier layer 40 should be thin enough as to not substantially increase the resistance of the subsequently completed MIM capacitor and the resistance of interconnects that may be formed near the MIM capacitor on the semiconductor substrate. In addition, the conductive oxidation barrier layer 40 should have good adhesion with the material used for the first metal layer 30 and the subsequently formed capacitor dielectric layer.

Figure 6:
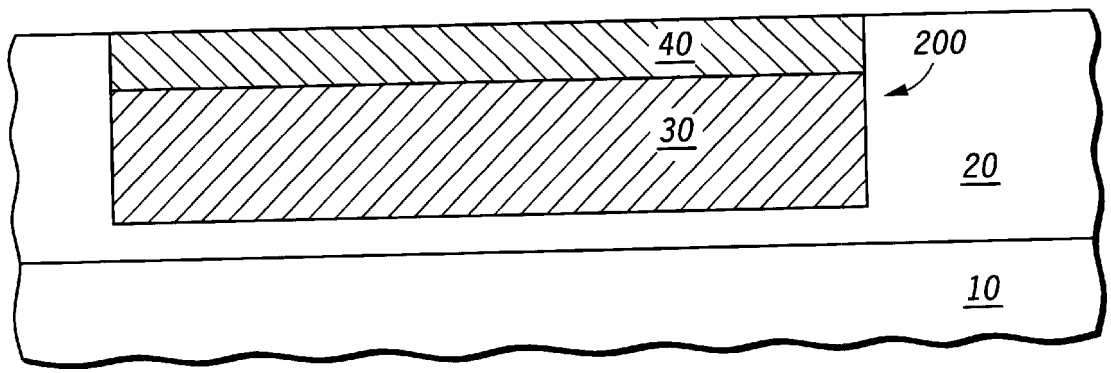
FIG. 6 illustrates the device of FIG. 5 after planarizing the second metal layer to form the bottom electrode of a MIM capacitor in accordance with one embodiment of the present invention.

Shown in FIG. 6 is the semiconductor device after planarizing the conductive oxidation barrier layer 40. In one embodiment, the conductive oxidation barrier layer 40 is removed outside of the recess 205 to self-align a periphery of the conductive oxidation barrier layer 40 to a periphery of the first metal layer 30. Any method used to planarize the first metal layer 30 can be used. If polished, it is desirable for the top surface of the conductive oxidation barrier layer 40 to be substantially coplanar with the top of the dielectric layer 20. The ability of the polishing process to achieve these results depends on the topography of the surface of the first metal layer 30 after forming the recess 205 and the selectivity of the process. Hence, a smooth surface of the first metal layer 30 and a high selectivity to the conductive oxidation barrier layer 40 are desirable. A substantially co-planar conductive oxidation barrier layer 40 prevents nano-scale oxidation of the underlying copper electrode and nano-scale diffusion of copper atoms into subsequently deposited dielectric materials, either of which would degrade capacitor leakage if it occurred.

Figure 7:
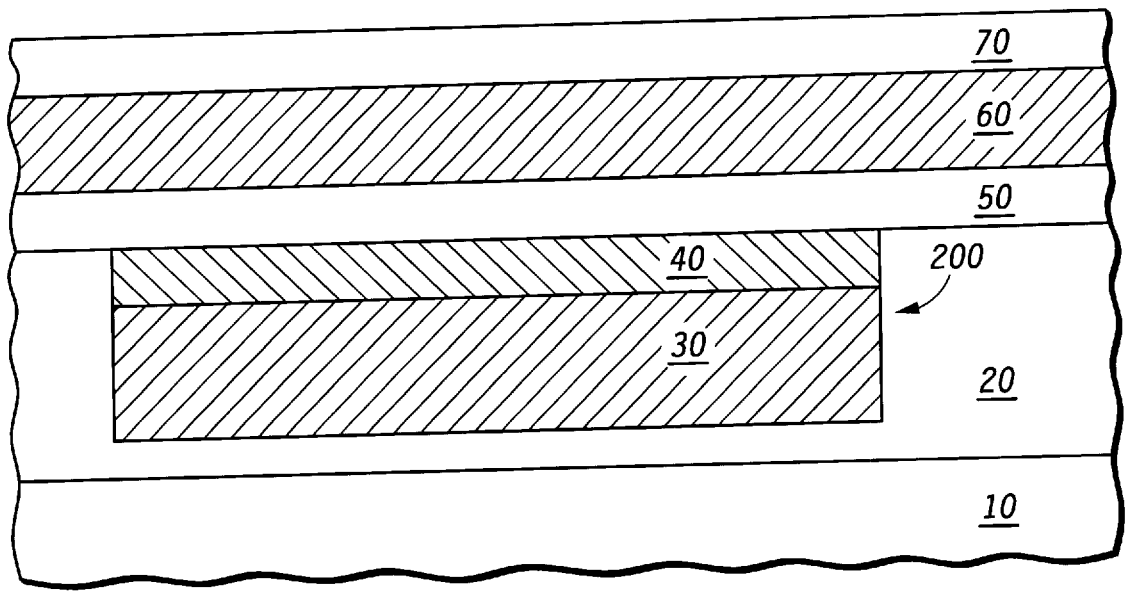
FIG. 7 illustrates the device of FIG. 6 after forming the capacitor dielectric layer, the third metal layer, and an etch stop layer in accordance with one embodiment of the present invention.

A capacitor dielectric layer 50, a third metal layer 60 and an etch stop layer (ESL) 70 are respectively deposited over the semiconductor substrate 10, as shown in FIG. 7. The capacitor dielectric layer 50 is an insulator formed on the conductive oxidation barrier layer 40 by using CVD, PVD, atomic layer deposition (ALD), combinations of the above or the like. For RF applications, the capacitor dielectric layer 50 preferably comprises a metal oxide that has high linearity (e.g. a normalized capacitance variation of typically less than 100 parts per million units of voltage), such as tantalum oxide and hafnium oxide. However, for general applications in which linearity may be less critical other metal oxides such as zirconium oxide, aluminum oxide, barium strontium titanate (BST), and strontium titanate (STO) may be suitable. The third metal layer 60 is formed over the capacitor dielectric layer 50 preferably using PVD, but other techniques including CVD, ALD, or combinations thereof could be used. The third metal layer 60 will form the second (top) electrode of the capacitor and thus can be formed of any conductive material such as tantalum, tantalum nitride, titanium, titanium nitride, ruthenium, iridium, copper, aluminum, platinum, tungsten combinations of the above, and the like.

In one embodiment, the third metal layer 60 comprises nitrogen and either tantalum or titanium (in the form of titanium nitride or tantalum nitride). If the third metal layer 60 is copper, it may be desirable to form a second oxidation barrier layer, such as the material used for the oxidation barrier layer 40, between the third metal layer 60 and the capacitor dielectric layer 50. However, there may not be an adhesion problem due to copper oxidation since the copper electrode is formed after depositing the metal oxide and thus, the copper electrode is not exposed to an oxidizing environment.

The ESL layer 70 is also deposited using PVD, CVD, ALD, or combinations thereof. As will become apparent below, the ESL layer 70 serves as an etch stop layer when etching a later deposited an interlayer dielectric (ILD). ESL layer 70 can also serve as a hard mask for etching metal layer 60. Furthermore, ESL layer 70 can serve as an antireflective coating (ARC) to improve optical properties during subsequent photolithography processes. In a preferred embodiment, the ESL layer 70 is silicon nitride or aluminum nitride, or alternatively tantalum oxide or hafnium oxide. Further detail of the use of ESL layer 70 is found in reference to FIG. 10 below.

The capacitor dielectric layer 50, third metal layer 60, and ESL layer 70 can be formed using the same or different processes. However, it may be desirable for the capacitor dielectric layer 50, third metal layer 60 and ESL layer 70 to be formed using the same process to improve process control and throughput in large-volume manufacturing environments.

Figure 8:
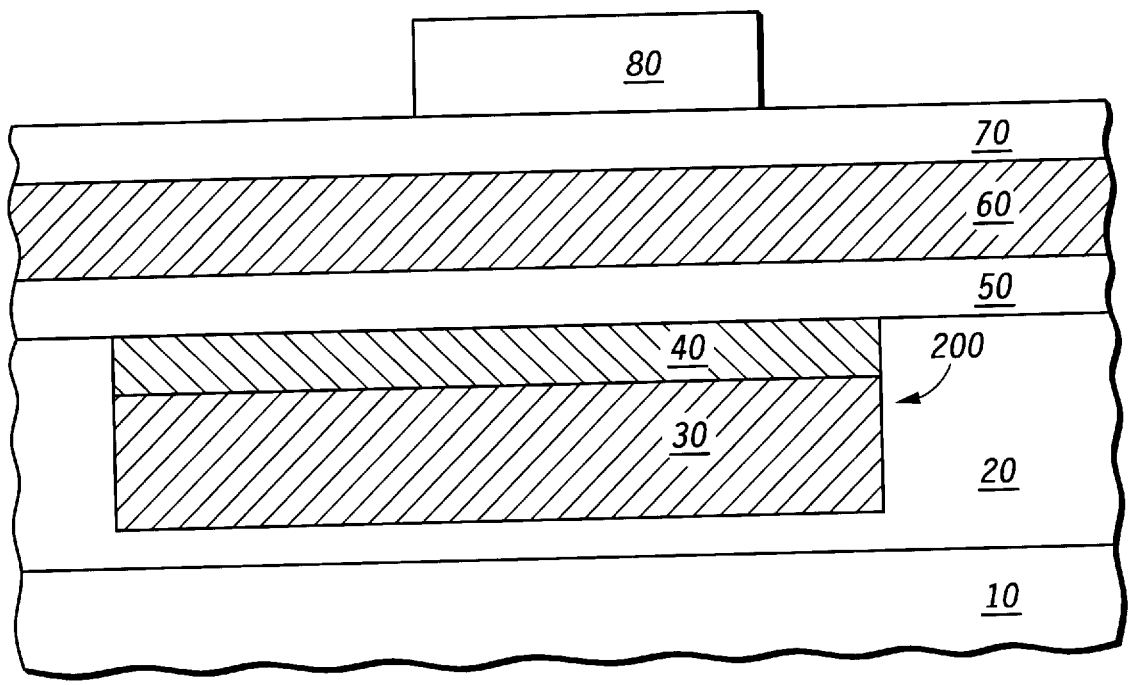
FIG. 8 illustrates the device of FIG. 7 after depositing a first photoresist layer in accordance with one embodiment of the present invention.
Figure 9:
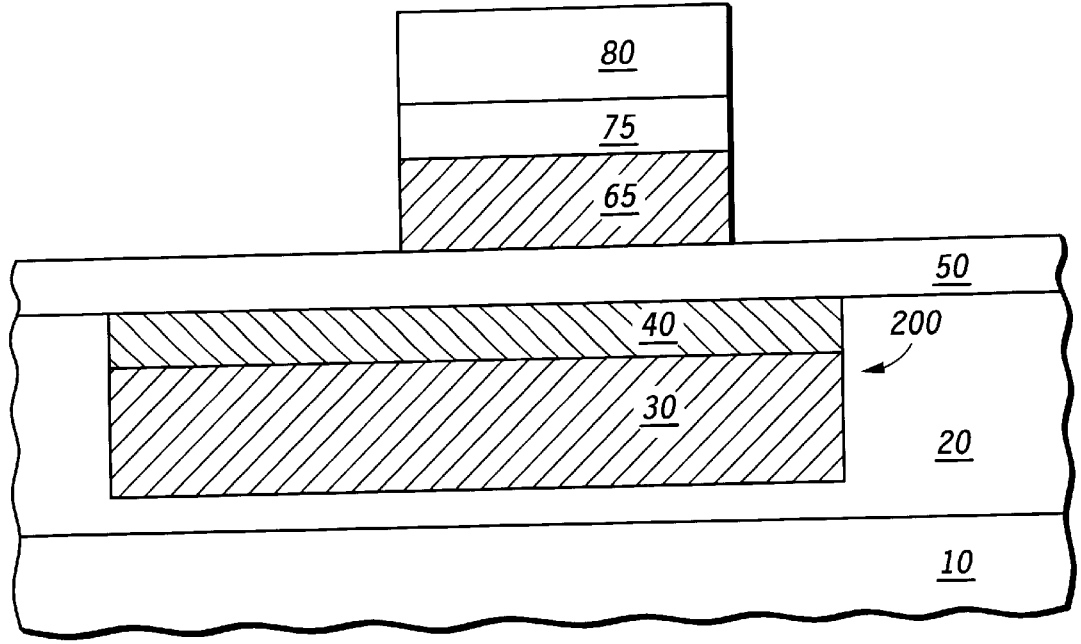
FIG. 9 illustrates the device of FIG. 8 after patterning the third metal layer and the etch stop layer to form the top electrode of the MIM capacitor in accordance with one embodiment of the present invention.

Turning to FIG. 8, a first photoresist layer 80 is deposited and patterned in order to etch the ESL layer 70 and the third metal layer 60. After etching the ESL layer 70 and the third metal layer 60, a top (capacitor) electrode 65 (or second electrode 65) is formed, as shown in FIG. 9. The first photoresist layer 80 is removed after patterning using conventional methods.

Figure 10:
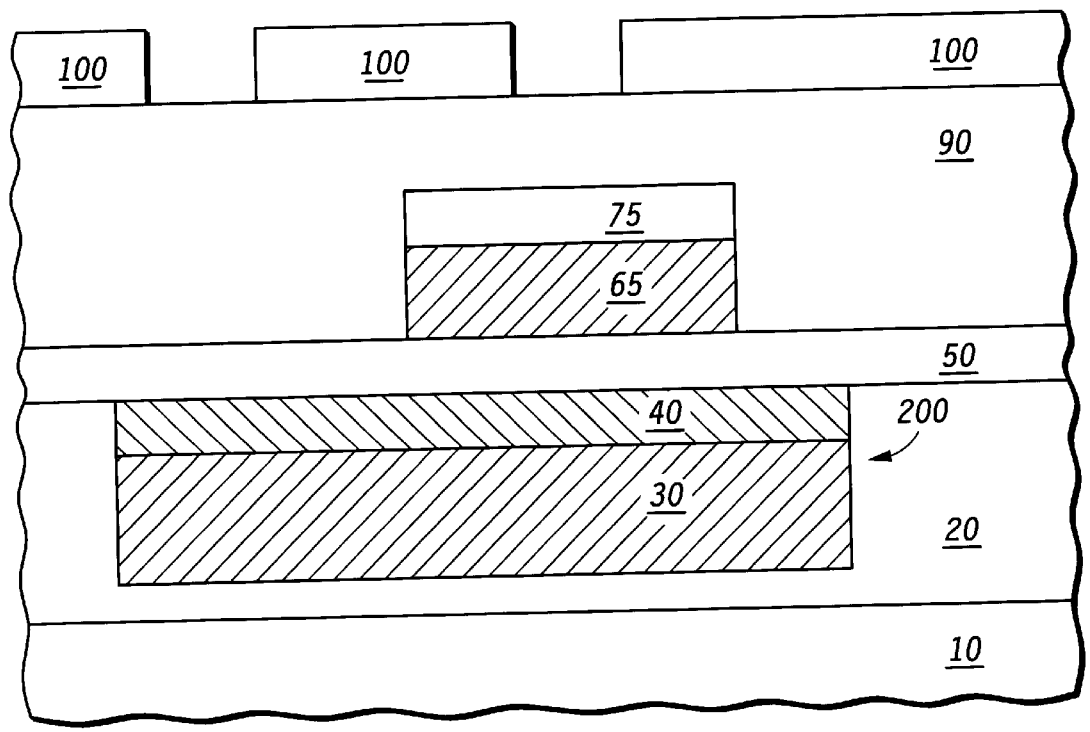
FIG. 10 illustrates the device of FIG. 9 after forming an interlevel dielectric layer and a second photoresist layer for patterning the interlevel dielectric layer in accordance with one embodiment of the present invention.

Turning to FIG. 10, an ILD 90 is deposited over the semiconductor substrate 10. A second photoresist layer 100 is deposited and patterned in order to etch the ILD layer 90 to form via openings, which are filled with metal to form conductive vias 110, shown in FIG. 11. A first chemistry is used to etch the via openings stopping on and exposing portions of the ESL layer 75 (where present) and the capacitor dielectric layer 50, which can both serve as intermediate etch stop layers. Since the thickness of the portion of the ILD that needs to be etched to form the via opening over the top electrode is substantially less than the thickness of the portion of the ILD to be etched to form the via opening for the conductive oxidation barrier layer 40, the ESL layer 75 should not be completely etched using the first chemistry. This enables the etch process to continue after etching the via openings above the top electrode 65 in order to form the deeper via opening for the conductive oxidation barrier layer 40. Thus, the first chemistry needs to be selective to the ESL layer material and perhaps even the capacitor dielectric layer 50.

Next, the etch chemistry is switched to a second chemistry for etching the exposed portions of the capacitor dielectric layer 50, and the ESL layer 75 to completely form the via openings and expose underlying conductive portions. Although the process uses two different etch chemistries, the etching of the via openings can occur in the same tool and even the same chamber for improved throughput and manufacturing efficiency.

Figure 11:
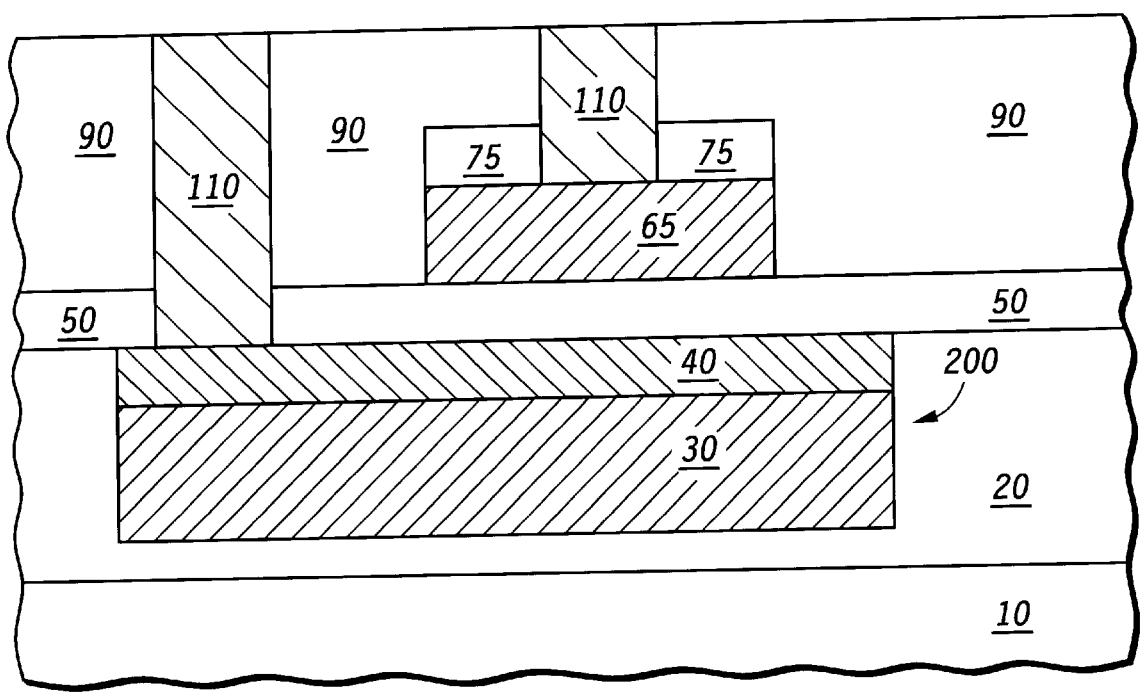
FIG. 11 illustrates the device of FIG. 10 after forming the conductive vias for electrically contacting the MIM capacitor in accordance with one embodiment of the present invention.

As shown in FIG. 11, after forming the via openings, a conductive material is formed within the via openings in order to form conductive vias 110. A conductor is formed in the via opening to form contacts to the top electrode 65 and conductive oxidation barrier layer 40. In one embodiment, copper is electroplated and chemically mechanically polished back to form conductive vias 110.

The resulting MIM capacitor shown in FIG. 11 has the advantage of a higher capacitance than previously proposed structures because it uses metal oxide materials for the primary capacitor dielectric without the disadvantage of a poor interface between the metal oxide and the copper electrode. Due to a compatible interface, a structure in accordance with the present invention has improved leakage characteristics. In addition, the MIM structure has a high linearity because the invention enables used of a metal oxide capacitor dielectric which itself has high linearity. Such on-chip capacitors are widely useful for demanding high-frequency (>1 Ghz) RF circuits, for mixed-signal analog and filtering. In addition, the need to use a photolithographic step to pattern the conductive oxidation barrier layer 40 is eliminated since the conductive oxidation barrier layer 40 is self-aligned.

The embodiment described as shown in the figures is a MIM capacitor wherein the top electrode 65 is smaller in size compared to the and first metal layer 30 and conductive oxidation barrier layer 40, which together form a bottom (capacitor) electrode. In another embodiment, the top electrode 65 can be oversized as compared to the first metal layer 30 and conductive oxidation barrier layer 40. In this embodiment, the contact for the conductive oxidation barrier layer 40 is formed prior to the formation of the first metal layer 30 and the conductive oxidation barrier layer 40 because the contact, instead of being formed over the conductive oxidation barrier layer 40, is underneath the first metal layer 30. In addition, in this embodiment it may be possible to completely remove the capacitor dielectric layer 50 without damaging critical portions of the capacitor structure when etching ESL layer 70 and third metal layer 60. By doing so the disadvantage of having a high dielectric constant material underneath ILD layer 90 is overcome. However, it remains possible that when removing the capacitor dielectric layer 50 from areas outside the MIM capacitor, that other structures underneath the layers, such as an adjacent copper pad structure, may be damaged. Such related structures are not explicitly shown in the figures, but are generally always present on-chip as an essential part of the IC interconnect circuitry.

Although the embodiment described above is in regards to a MIM capacitor, it is possible to use the method of formation in other applications to decrease copper oxidation and improve adhesion, such as at the last metal layer formed on the semiconductor substrate.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

In the foregoing specification, the invention has been described with reference to specific embodiments. However, one of ordinary skill in the art appreciates that various modifications and changes can be made without departing from the scope of the present invention as set forth in the claims below. For example, as described and illustrated, the MIM capacitor is formed in a single damascene manner within the device. However, one of ordinary skill would recognize that a similar structure could be incorporated into a dual damascene integration. Accordingly, the specification and figures are to be regarded in an illustrative rather than a restrictive sense, and all such modifications are intended to be included within the scope of present invention.

What is claimed:

1. A process for forming a metal-insulator-metal (MIM) capacitor structure comprising:
   providing a semiconductor substrate;
   forming a dielectric layer over the semiconductor substrate;
   forming a recess in the dielectric layer;
   forming a first metal layer in the recess, the first metal layer comprising copper;
   recessing the first metal layer;
   forming a second metal layer over the first metal layer, the second metal layer being a conductive oxidation barrier for the first metal layer, wherein the first metal layer and the second metal layer are a bottom electrode of the mim capacitor structure;
   forming an insulator over the second metal layer; and
   forming a third metal layer over the insulator, wherein the third metal layer is a top electrode of the MIM capacitor structure.

2. The process of claim 1, wherein recessing the first metal layer comprises recessing the first metal layer using a wet etch process.

3. The process of claim 1, wherein recessing the first metal layer comprises recessing the first metal layer using a dry etch process.

4. The process of claim 1, wherein the second metal layer is selected from the group consisting of: tantalum, tantalum nitride, titanium, titanium nitride, platinum, iridium, aluminum, tungsten, and ruthenium.

5. The process of claim 1, wherein forming the first metal layer further comprises:
   depositing the first metal layer over a surface of the dielectric layer; and
   planarizing the first metal layer to form a damascene structure.

6. The process of claim 1, wherein forming a second metal layer further comprises forming the second metal layer to have a thickness of between 50 and 2000 angstroms.

7. The process of claim 1, wherein forming a second metal layer comprises:
   depositing the second metal layer over the surface of the dielectric layer and the recessed first metal layer;
   removing all of the second metal layer outside of the recess in the first metal layer to self-align a periphery of the second metal layer to a periphery of the first metal layer; and
   planarizing the second metal layer to be coplanar with the surface of the dielectric layer.

8. The process of claim 1, wherein forming the second metal layer comprises depositing the second metal layer using one of physical vapor deposition, chemical vapor deposition, atomic layer deposition, electroplating, and electroless plating.

9. The process of claim 1, wherein the insulator comprises a metal oxide selected from the group consisting of tantalum oxide, aluminum oxide, strontium titanate, barium strontium titanate, zirconium oxide, and hafnium oxide.

10. A process for forming a metal-insulator-metal (MIM) capacitor structure comprising:
    providing a semiconductor substrate;
    forming a dielectric layer over the semiconductor substrate;
    forming a recess in the dielectric layer;
    forming a first metal layer in the recess, the first metal layer comprising copper;
    recessing the first metal layer;
    forming a second metal layer over the first metal layer, the second metal layer being a conductive oxidation barrier for the first metal layer;
    forming an insulator over the second metal layer;
    forming a third metal layer over the insulator;
    forming a via opening in the insulator over the conductive oxidation barrier; and
    filling the via opening with a conductive material to form a contact to the conductive oxidation barrier.

* * * * *